(12) United States Patent
Ma et al.

(10) Patent No.: US 11,322,437 B2
(45) Date of Patent: May 3, 2022

(54) FLIP CHIP INTERCONNECTION AND CIRCUIT BOARD THEREOF

(71) Applicant: CHIPBOND TECHNOLOGY CORPORATION, Hsinchu (TW)

(72) Inventors: Yu-Chen Ma, Kaohsiung (TW); Hsin-Hao Huang, Kaohsiung (TW); Wen-Fu Chou, Kaohsiung (TW); Gwo-Shyan Sheu, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 20 days.

(21) Appl. No.: 17/038,237

(22) Filed: Sep. 30, 2020

(65) Prior Publication Data
US 2021/0265255 A1    Aug. 26, 2021

(30) Foreign Application Priority Data
Feb. 26, 2020  (TW) .................................. 109106351

(51) Int. Cl.
*H01L 23/498* (2006.01)
*H01L 23/00* (2006.01)

(52) U.S. Cl.
CPC ........ *H01L 23/49838* (2013.01); *H01L 24/16* (2013.01); *H01L 24/17* (2013.01); *H01L 2224/16238* (2013.01); *H01L 2224/17153* (2013.01)

(58) Field of Classification Search
CPC ... H01L 23/49838; H01L 24/16; H01L 24/17; H01L 2224/16238; H01L 2224/17153; H05K 1/181; H05K 3/3426
See application file for complete search history.

(56) References Cited

U.S. PATENT DOCUMENTS

| 6,617,521 B1 | 9/2003 | Saito et al. |
| 2005/0061540 A1 | 3/2005 | Parker et al. |
| 2006/0131064 A1 | 6/2006 | Hagiwara |

(Continued)

FOREIGN PATENT DOCUMENTS

| CN | 1913749 A | 2/2007 |
| CN | 110169209 A | 8/2019 |

(Continued)

OTHER PUBLICATIONS

Taiwanese Office Action dated Jul. 27, 2020 for Taiwanese Patent Application No. 109106351, 6 pages.

(Continued)

*Primary Examiner* — Douglas W Owens
(74) *Attorney, Agent, or Firm* — Demian K. Jackson; Jackson IPG PLLC

(57) ABSTRACT

A flip chip interconnection including a circuit board is disclosed. The circuit board includes a substrate, inner leads, a T-shaped circuit line and a dummy pattern. The inner leads, the T-shaped circuit line and the dummy pattern are located on an inner bonding area of the substrate. The T-shaped circuit line includes a main segment, a branch segment and a connection segment that is connected to the main segment and the branch segment. The main segment and the branch segment are extended along a lateral direction and a longitudinal direction, respectively. The dummy pattern is located between the connection segment and the inner leads.

19 Claims, 6 Drawing Sheets

(56) References Cited

U.S. PATENT DOCUMENTS

| | | |
|---|---|---|
| 2007/0034596 A1 | 2/2007 | Ueno et al. |
| 2008/0203563 A1 | 8/2008 | Takahashi |
| 2009/0153791 A1 | 6/2009 | Chang et al. |
| 2009/0189274 A1 | 7/2009 | Kim |
| 2011/0203840 A1 | 8/2011 | Wu |
| 2015/0206832 A1* | 7/2015 | Kudo ............... H01L 23/49838 257/676 |
| 2015/0311148 A1 | 10/2015 | Jung et al. |
| 2018/0005929 A1 | 1/2018 | Shin et al. |

FOREIGN PATENT DOCUMENTS

| | | |
|---|---|---|
| JP | 03-244181 A | 10/1991 |
| JP | 2000-165006 A | 6/2000 |
| JP | 2000-208881 A | 7/2000 |
| JP | 2002-311848 A | 10/2002 |
| JP | 2005-244211 A | 9/2005 |
| JP | 2007-048963 A | 2/2007 |
| JP | 2008-177477 A | 7/2008 |
| KR | 10-2020-0102622 A | 9/2020 |
| KR | 10-2020-0130550 A | 11/2020 |
| TW | 200924121 A | 6/2009 |

OTHER PUBLICATIONS

Japanese Notice of Allowance dated Jan. 31, 2022 for Japanese Patent Application No. 2020-170601, 3 pages.

* cited by examiner

FLIP CHIP INTERCONNECTION AND CIRCUIT BOARD THEREOF

FIELD OF THE INVENTION

This invention relates to a flip chip interconnection, and more particularly to a flip chip interconnection that enables a chip to be bonded to a circuit board having T-shaped circuit line and dummy pattern.

BACKGROUND OF THE INVENTION

In metal etching process, metal exposed by patterned photoresist is etched to be removed by etching solution so as to form fine pattern profile. The etching solution should flow through the patterned photoresist to etch the exposed metal evenly. In practice, however, the etching solution is easy to accumulate in a space surrounded by the patterned photoresist on three sides due to slowing-down flow rate in the space, and open circuit and fine line breaking may occur easily caused by over-etching.

SUMMARY

One object of the present invention is to provide dummy pattern around T-shaped circuit line of circuit board to prevent the T-shaped circuit line from being over-etched by etching solution accumulated around the T-shaped circuit line.

A circuit board of the present invention includes a substrate, inner leads, a T-shaped circuit line and a dummy pattern. An inner bonding area is defined on a surface of the substrate and divided into a first area and a second area, the first area is located outside the second area. The inner leads are located on the first area, the T-shaped circuit line is located on the second area and includes a main segment, a connection segment and a branch segment. The main segment is connected to the connection segment and extended along a lateral direction. The branch segment is connected to the connection segment and extended toward the first area along a longitudinal direction for bonding with a bump. The dummy pattern is located between the connection segment and the inner leads and not electrically connected to the inner leads and the T-shaped circuit line.

A flip chip interconnection of the present invention includes the circuit board as above-mentioned, a chip and a solder layer. The chip is mounted on the inner bonding area and includes first bumps and a second bump. The solder layer is located between the circuit board and the chip for bonding the first bumps to the inner leads and bonding the second bump to the branch segment.

The dummy pattern of the present invention is formed between the connection segment and the inner leads so as to be located in the space surrounded by the connection segment, the branch segment and the inner leads. The dummy pattern is provided to prevent etching solution from accumulating around the connection segment and the branch segment, thus protect the connection segment and/or the branch segment from breaking caused by over-etching on the T-shaped circuit line.

DETAILED DESCRIPTION OF THE INVENTION

Figure 1:
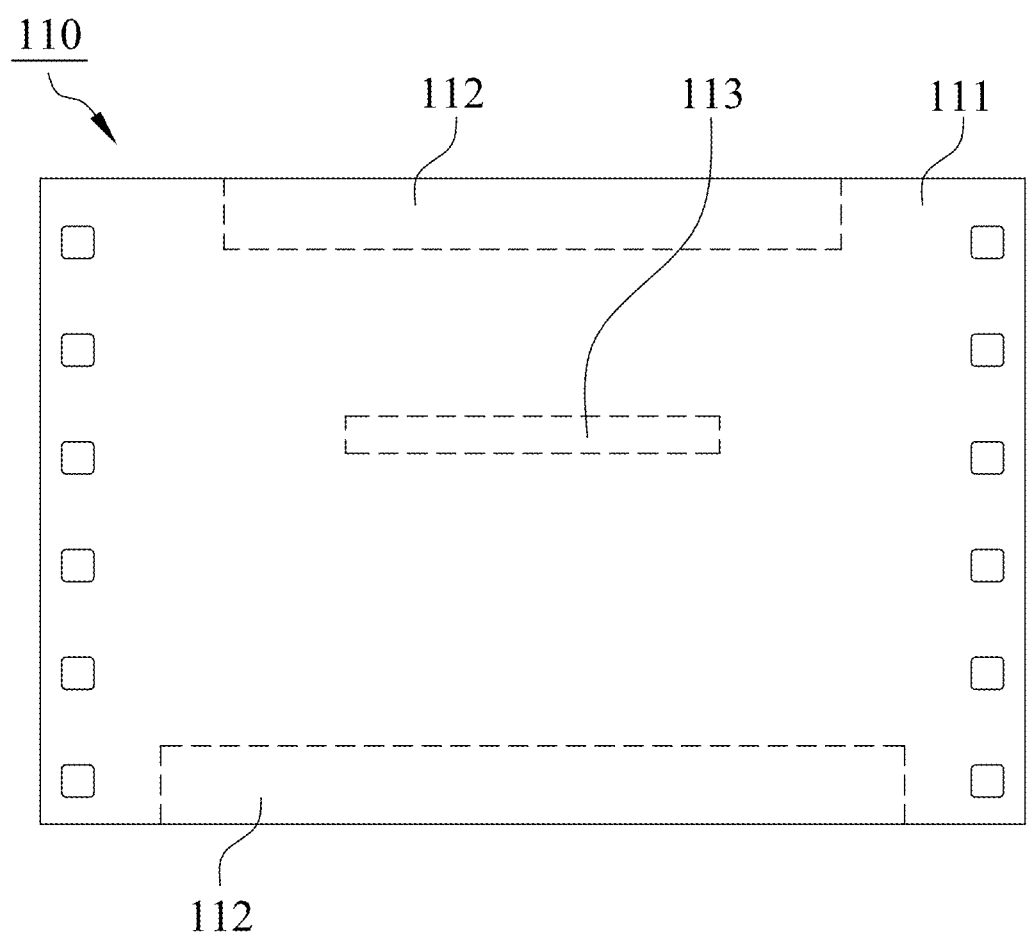
FIG. 1 is a top view diagram illustrating a substrate in accordance with a preferred embodiment of the present invention.
Figure 2:
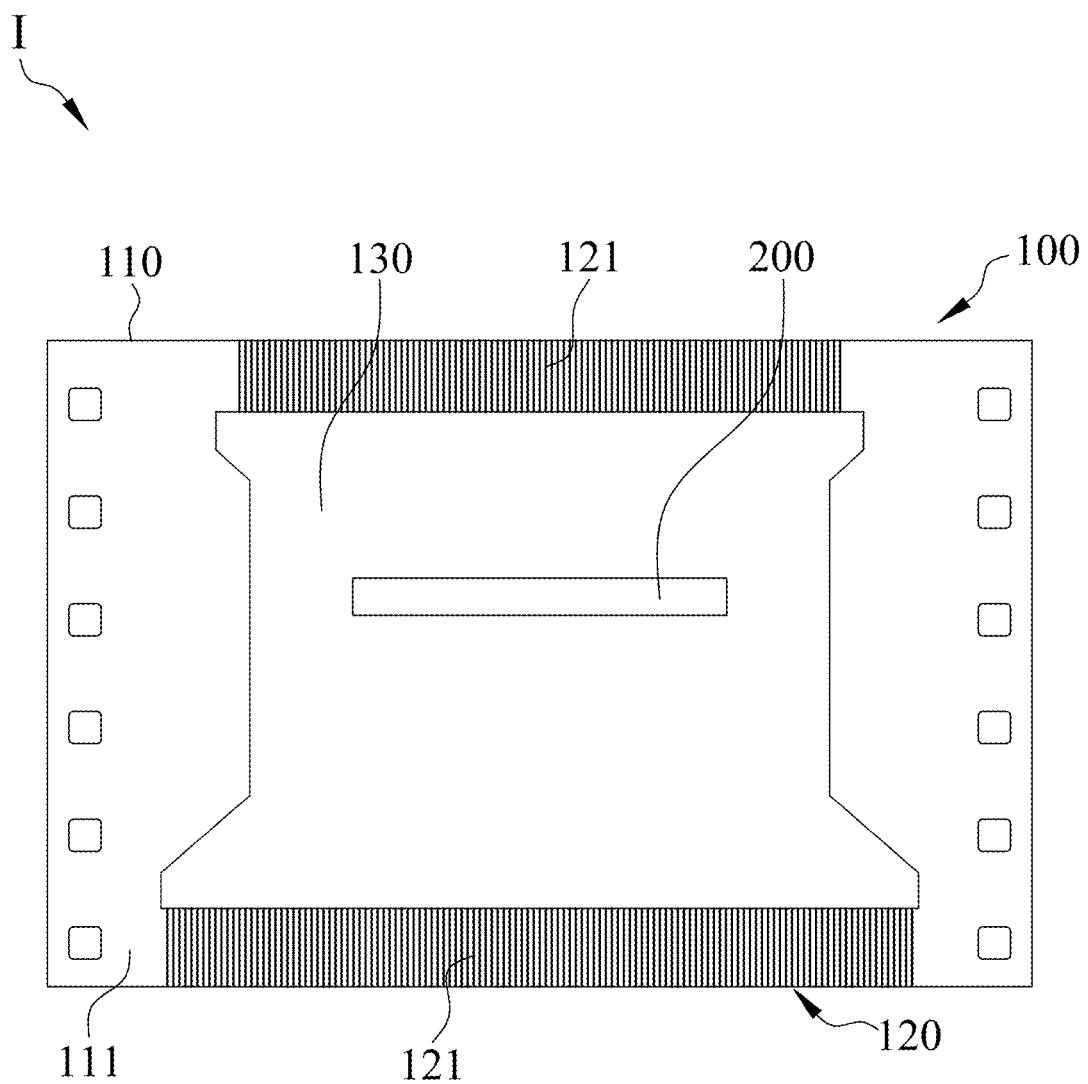
FIG. 2 is a top view diagram illustrating a flip chip interconnection in accordance with a preferred embodiment of the present invention.
Figure 3:
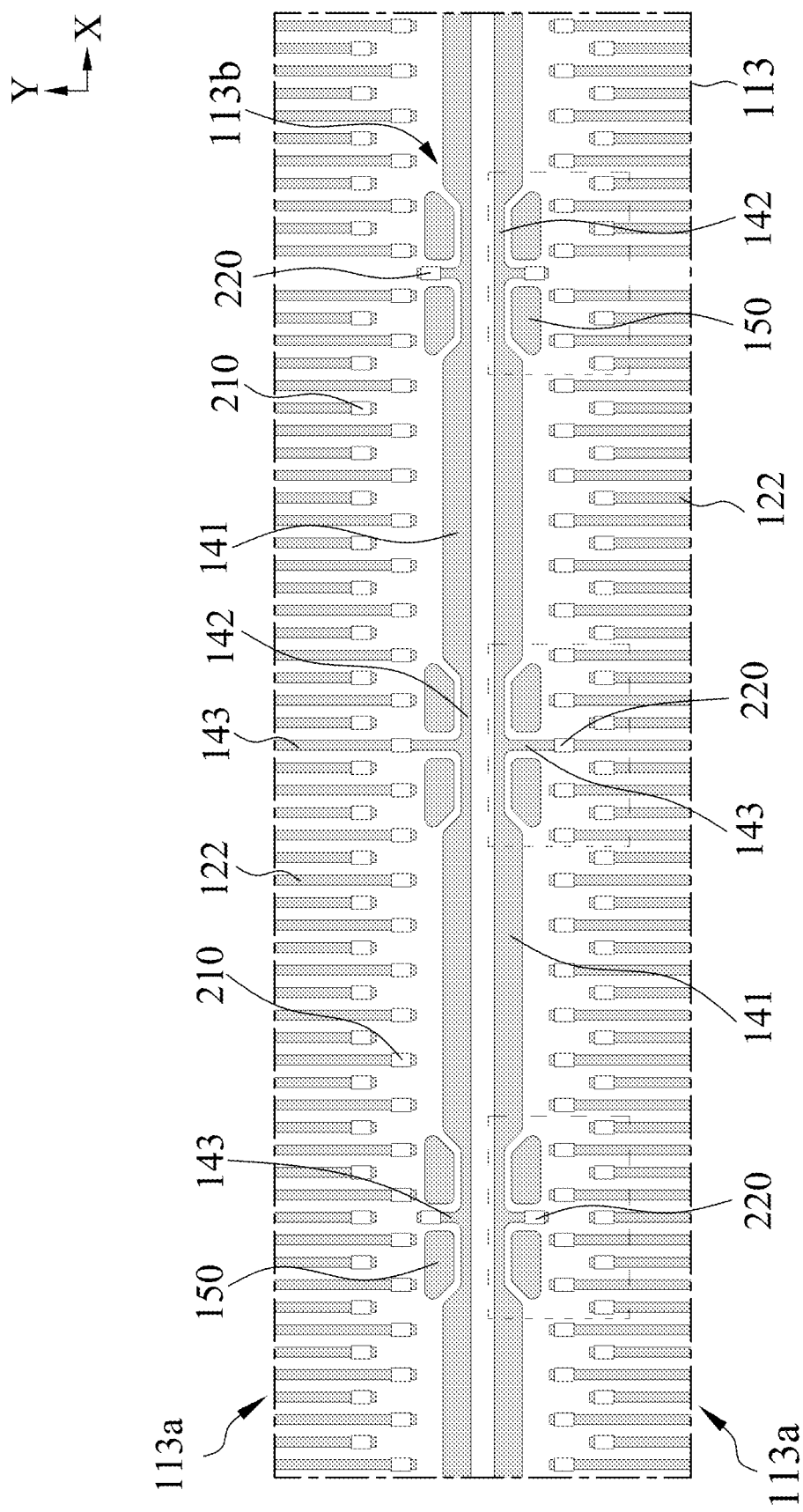
FIG. 3 is a top view diagram illustrating a part of an inner bonding area of a circuit board in accordance with a preferred embodiment of the present invention.

With reference to FIGS. 1 to 3, a circuit board 100 in accordance with a preferred embodiment of the present invention includes a substrate 110 and a circuit layer 120 that is located on a surface 111 of the substrate 110. An outer bonding area 112 and an inner bonding area 113 are defined on the surface 111. The circuit layer 120 includes outer leads 121 and inner leads 122 that are located on the outer bonding area 112 and the inner bonding area 113, respectively. In this preferred embodiment, the outer leads 121 and the inner leads 122 are arranged on the outer bonding area 112 and the inner bonding area 113, respectively, along a lateral direction X. The inner bonding area 113 is divided into a first area 113a and a second area 113b, and the first area 113a is located outside the second area 113b. Preferably, the inner bonding area 113 is divided into two first areas 113a and one second area 113b, the second area 113b is located between the two first areas 113a, and the inner leads 122 are arranged on the two first areas 113a.

The substrate 110 may be made of polyimide (PI), polyethylene terephthalate (PET), glass, ceramic, metal or other material, and the circuit layer 120 may be made of copper (Cu), nickel (Ni), gold (Au) or other metal or alloy.

With reference to FIG. 2, the circuit board 100 preferably further includes a solder resist layer 130 that covers the circuit layer 120, except the outer leads 121 and the inner leads 122. The solder resist layer 130 is provided to protect the circuit layer 120, and the exposed outer leads 121 and the exposed inner leads 122 are provided to bond to an electronic device and a chip, respectively.

Figure 4:
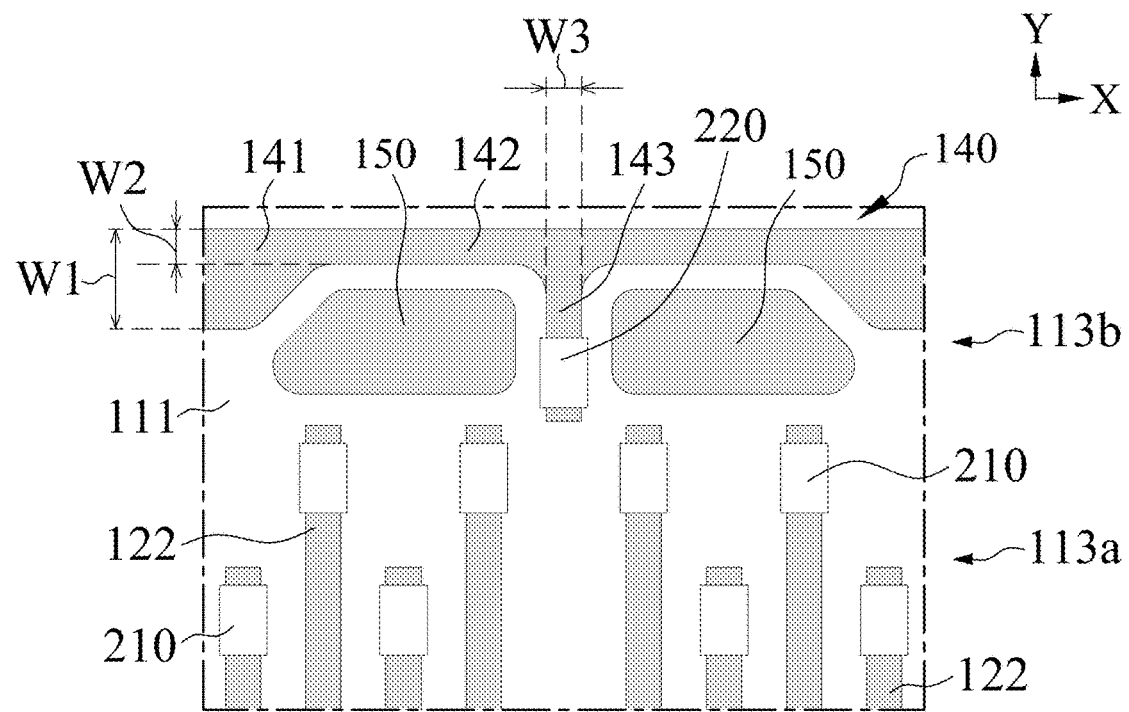
FIG. 4 is a partial enlarged diagram of FIG. 3.

With reference to FIGS. 3 and 4, the circuit board 100 further includes at least one T-shaped circuit line 140 located on the second area 113b of the inner bonding area 113. The T-shaped circuit line 140 is designed for ground connection or power connection and is not electrically connected to the inner leads 122. The T-shaped circuit line 140 includes a main segment 141, a connection segment 142 and a branch segment 143, the main segment 141 is connected to the connection segment 142 and extended along the lateral direction X, and the branch segment 143 for bonding with a bump is connected to the connection segment 142 and extended toward the first area 113a along a longitudinal direction Y. In the preferred embodiment, the main segment 141 and the connection segment 142 connected with each other are linear, and the connection segment 142 and the branch segment 143 connected to one another are perpendicular. However, in different embodiment(s), the connection of the main segment 141 and the connection segment 142 may be nonlinear, and the included angle between the connection segment 142 and the branch segment 143 may be greater or less than 90 degrees, or equal to 90 degrees.

Preferably, there are multiple T-shaped circuit lines 140 on the circuit board 100, the main segments 141 of the T-shaped circuit lines 140 are extended along the lateral direction X to connect with each other, and the branch segments 142 of the T-shaped circuit lines 140 are extended toward the first area 113a of the inner bonding area 113 along the longitudinal direction Y for bonding bumps.

With reference to FIGS. 3 and 4, the circuit board 100 further includes at least one dummy pattern 150 that is located between the connection segment 142 and the inner leads 122 and not electrically connected to the T-shaped circuit line 140 and the inner leads 122. The profile of the dummy pattern 150 is adjustable according to the arrangement of the surrounding circuit lines without restrictions in the present invention. The dummy pattern 150 is provided to protect the T-shaped circuit line 140 from damage, particularly, protect the connection segment 142 and the branch segment 143 from breaking caused by over-etching. There may be two dummy patterns 150 of the same or different profiles located at two sides of the branch segment 143 symmetrically or asymmetrically.

In the preferred embodiment, the circuit layer 120, the T-shaped circuit line 140 and the dummy pattern 150 are formed on the substrate 110 by the same etching process. The dummy pattern 150 is located in the space surrounded by the connection segment 142, the branch segment 143 and the inner leads 122 and able to prevent etching solution from accumulating around the connection segment 142 and the branch segment 143 so as to reduce possibility of damage of the connection segment 142 and the branch segment 143 caused by over-etching.

Figure 5:
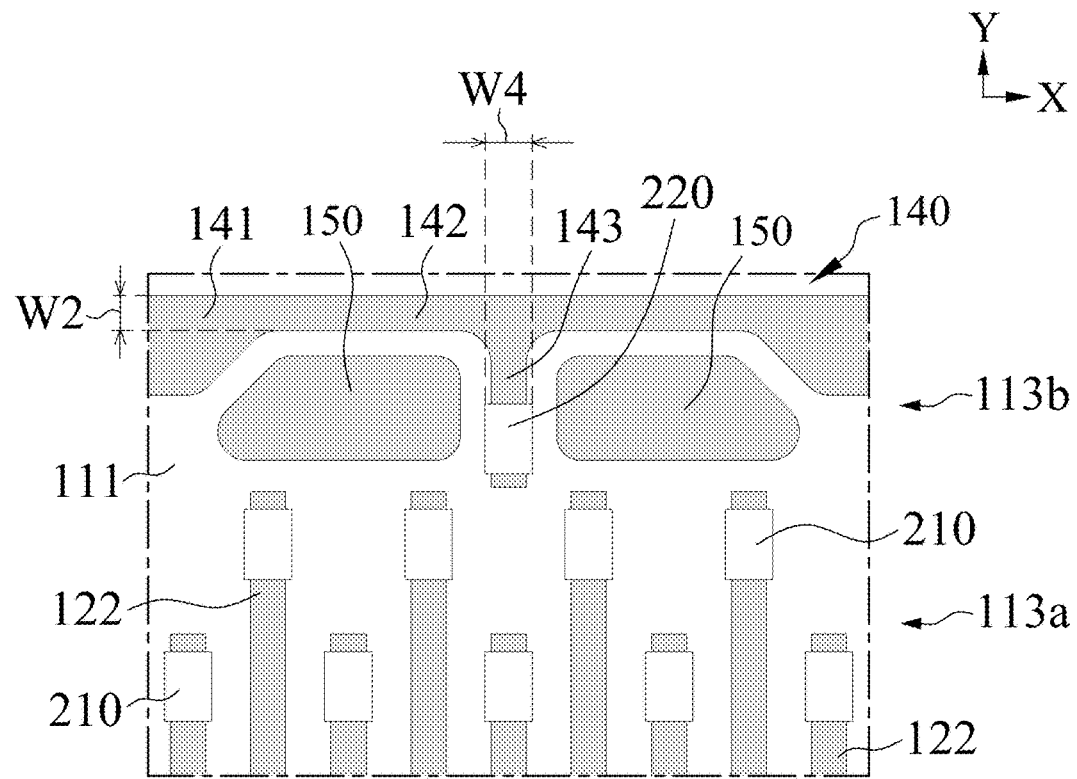
FIG. 5 is a partial enlarged diagram of FIG. 3.
Figure 6:
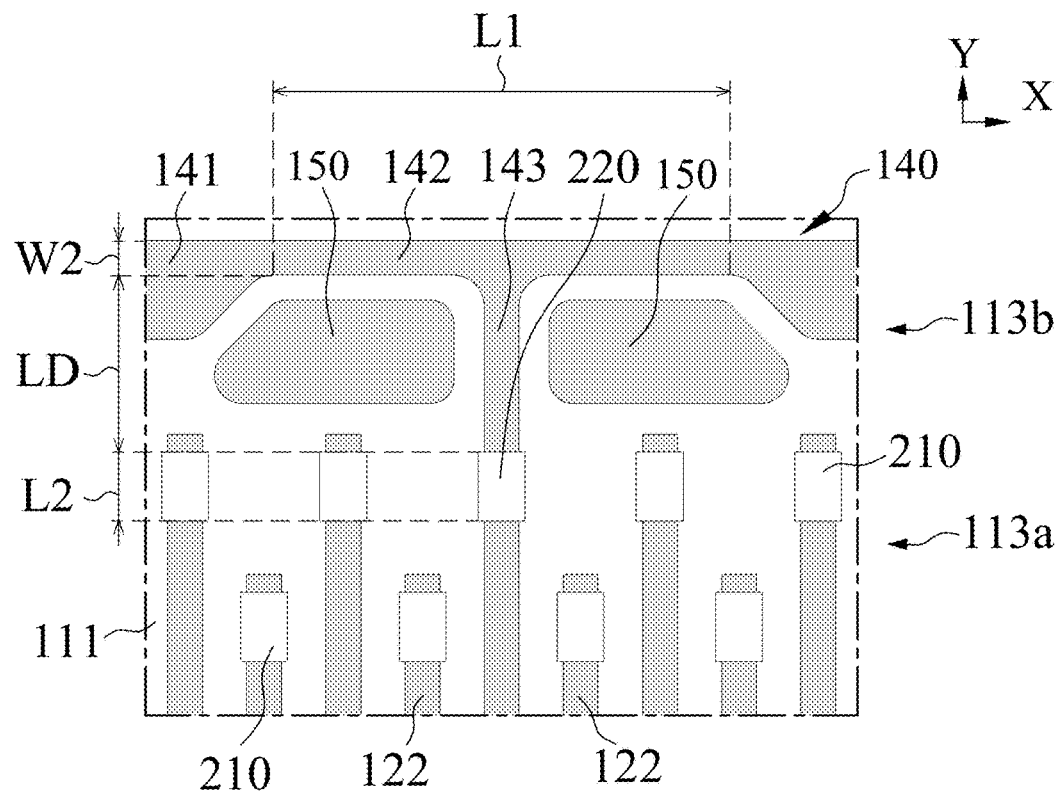
FIG. 6 is a partial enlarged diagram of FIG. 3.
Figure 7:
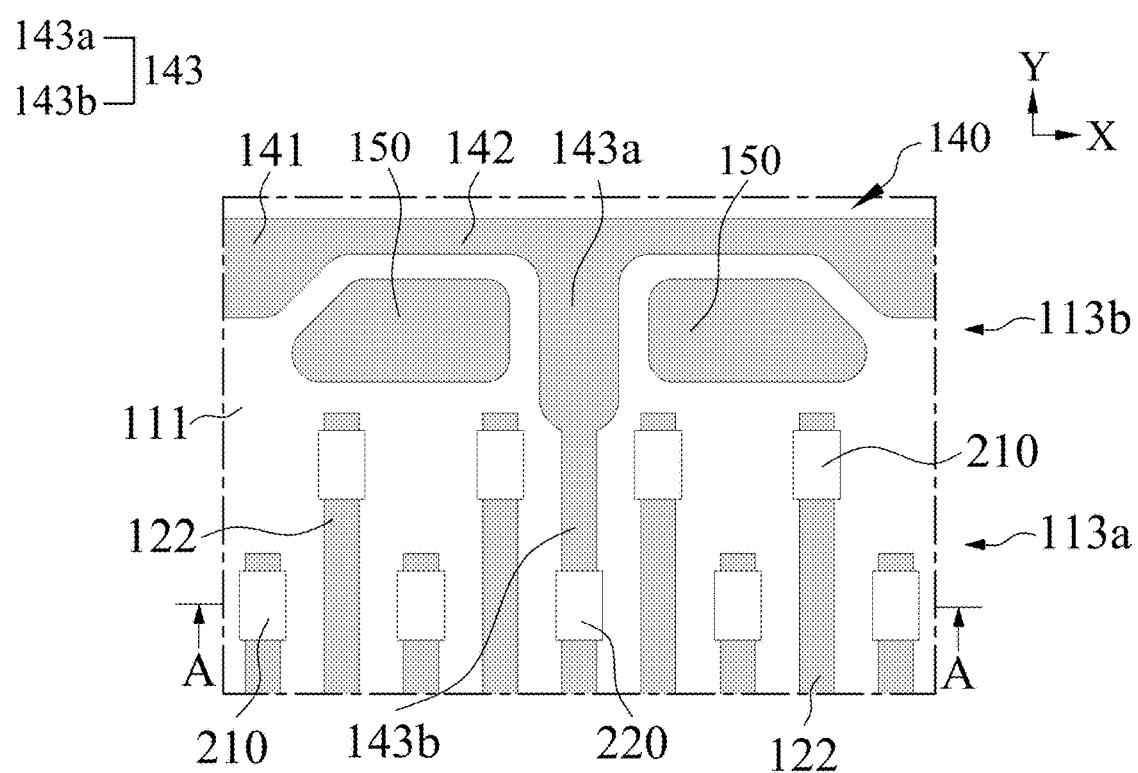
FIG. 7 is a top view diagram illustrating a part of an inner bonding area of a circuit board in accordance with a preferred embodiment of the present invention.
Figure 8:
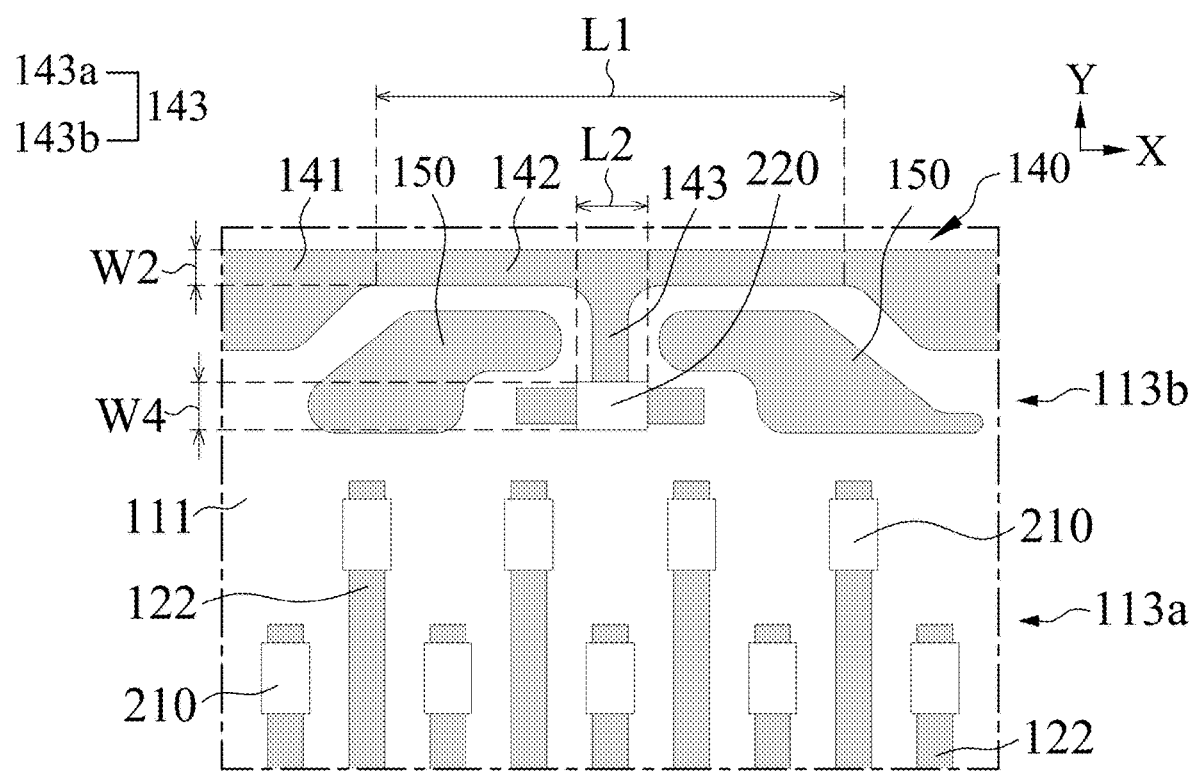
FIG. 8 is a top view diagram illustrating a part of an inner bonding area of a circuit board in accordance with a preferred embodiment of the present invention.

FIGS. 4 to 8 represent the T-shaped circuit lines 140 of different possible patterns, respectively. The branch segment 143 shown in FIG. 5 is extended toward one of the inner leads 122 along the longitudinal direction Y, different to that shown in FIG. 4. The branch segment 143 shown in FIG. 6 is extended to between two adjacent inner leads 122 along the longitudinal direction Y and preferably has the same line width as the inner leads 122. With reference to FIG. 7, the branch segment 143 has a first end 143a and a second end 143b, the first end 143a is connected to the connection segment 142 and the second end 143b is provided for bonding a bump. Additionally, the first end 143a has a width greater than that of the second end 143b, thus the connection segment 142 and the branch segment 143 are protected from breaking, and the second end 143b is located between two adjacent inner leads 122. In another embodiment, as shown in FIG. 8, the branch segment 143 is nonlinear and the first end 143a is perpendicular to the second end 143b.

Figure 9:
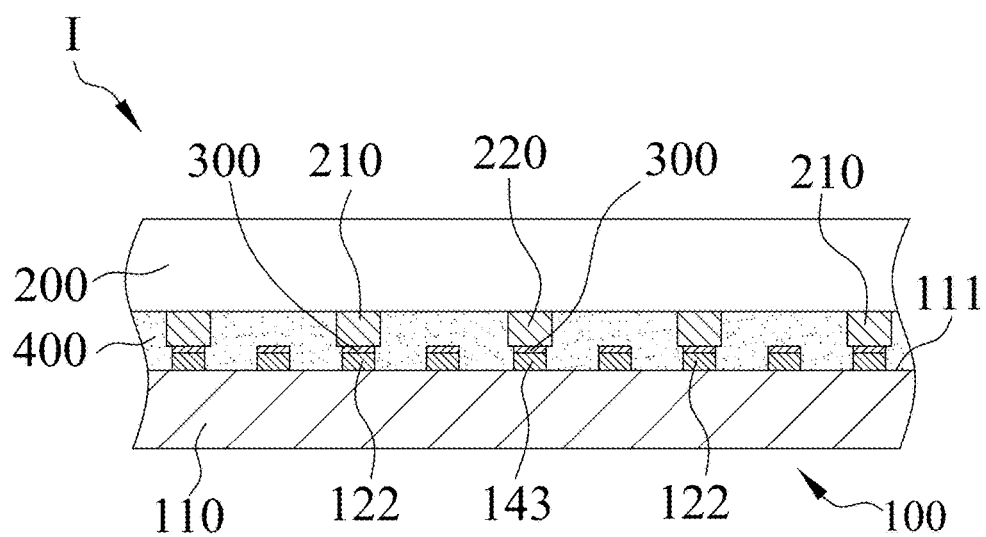
FIG. 9 is a cross-section view diagram illustrating a flip chip interconnection in accordance with a preferred embodiment of the present invention.

With reference to FIGS. 2 and 9, a flip chip interconnection I in accordance with a preferred embodiment of the present invention includes the circuit board 100 as mentioned previously, a chip 200 and a solder layer 300. The chip 200 is mounted on the inner bonding area 113 of the substrate 110 and includes first bumps 210 and at least one second bump 220. The solder layer 300 is located between the circuit board 100 and the chip 200 for the bonding of the first bumps 210 with the inner leads 122 and for the bonding of the second bump 220 with the branch segment 143 of the T-shaped circuit line 140. The solder layer 300 has a thickness, preferably less than or equal to 0.30 µm, and more preferably less than or equal to 0.20 µm. In a preferred embodiment, the solder layer 300 is formed on the inner leads 122 and the T-shaped circuit line 140 and has a thickness of 0.16±0.40 µm. In the thermal bonding process, the chip 200 is placed on the inner bonding area 113 and then the solder layer 300 is heated to be softened for bonding the chip 200 to the circuit board 100.

The heat-softened solder layer 300 has the flowability, for this reason, while the second bump 220 is bonded to the branch segment 143, the solder layer 300 on the T-shaped circuit line 140 flows toward the branch segment 143 from different directions with high possibility of overflow. The T-shaped circuit line 140 of the present invention can be modified in pattern to prevent solder overflow and solder short.

With reference to FIG. 4, along the longitudinal direction Y, the main segment 141 has a first width W1 and the connection portion 142 has a second width W2 that is preferably less than the first width W1. Because of the width reduction of the connection segment 142, the amount of softened solder flowing from the connection segment 142 to the branch segment 143 can be reduced effectively. As a result, solder overflow induced by excess softened solder flowing toward the second bump 220 is significantly reduced.

Furthermore, the branch segment 143 has a third width W3 along the lateral direction X, and the quotient of the second width W2 and the third width W3 is higher than or equal to 0.5

$$\left(\frac{W2}{W3} \geq 0.5\right).$$

The quotient is between 0.5 and 1

$$\left(0.5 \leq \frac{W2}{W3} < 1\right)$$

when the second width W2 is less than the third width W3, the quotient is 1

$$\left(\frac{W2}{W3} = 1\right)$$

when the second width W2 is equal to the third width W3, and the quotient is higher than 1

$$\left(\frac{W2}{W3} > 1\right)$$

when the second width W2 is greater than the third width W3.

In addition to change the width of the main segment 141, the connection segment 142 or the branch segment 143 with the restriction of width quotient, the width of the connection segment 142 can be determined according to the size of the second bump 220. As shown in FIG. 5, the second bump 220 has a fourth width W4 along the lateral direction X, and the quotient of the second width W2 and the fourth width W4 is preferably less than 2

$$\left(\frac{W2}{W4} < 2\right).$$

The quotient between 1 and 2

$$\left(1 < \frac{W2}{W4} < 2\right)$$

indicates that the second width W2 is higher than the fourth width W4 and less than double of the fourth width W4, the quotient of 1

$$\left(\frac{W2}{W4} = 1\right)$$

indicates that the second width W2 and the fourth width W4 are the same, and the quotient less than 1

$$\left(0 < \frac{W2}{W4} < 1\right)$$

indicates that the second width W2 is less than the fourth width W4.

With reference to FIG. 6, a first length L1 of the connection segment 142 is defined along the lateral direction X and a second length L2 of the second bump 220 is defined along the longitudinal direction Y. Preferably, the connection segment 142 is not shorter than four times of the second bump 220, in other words, the quotient of the first length L1 and the second length L2 is higher than or equal to 4

$$\left(\frac{L1}{L2} \geq 4\right).$$

The length of the width-reduced connection segment 142 can be determined based on the length of the second bump 220. In a preferred embodiment, the branch segment 143 is connected to the central part of the connection segment 142 and the shortest distance from the branch segment 143 to one of both ends of the connection segment 142 is equal to one another. However, the branch segment 143 of the present invention is not limited in position, it can be connected to any part of the connection segment 142 according to different layout requirements.

With reference to FIG. 6, a linear distance LD between the connection segment 142 and the second bump 220 is the shortest distance from the connection segment 142 to the second bump 220, and the quotient of the linear distance LD and the second width W2

$$\left(\frac{LD}{W2}\right)$$

is required to be proportional to the thickness of the solder layer 300. The linear distance LD has to be increased when the solder layer 300 is increased in thickness and the connection segment 142 is not decreased in width in order to lower the occurrence rate of solder short resulted from excess softened solder flowing to the branch segment 143.

Preferably, while the solder layer 300 has a thickness of 0.16 μm, the linear distance LD has to be higher than or equal to three times of the second width W2, namely, the quotient of the linear distance LD and the second width W2 is not less than 3

$$\left(\frac{LD}{W2} \geq 3\right).$$

And if the solder layer 300 has a thickness of 0.18 μm, the linear distance LD has to be higher than or equal to four times of the second width W2 so the quotient of the linear distance LD and the second width W2 is higher than or equal to 4

$$\left(\frac{LD}{W2} \geq 4\right).$$

In the embodiments shown in FIGS. 4 to 7, the second bump 220 has the fourth width W4 along the lateral direction X and has the second length L2 along the longitudinal direction Y, and the dummy patterns 150 located at two sides of the branch segment 143 have the same shape and mirror symmetrical to one another. In the embodiment as shown in FIG. 8, the second bump 220 has the fourth width W4 along the longitudinal direction Y and has the second length L2 along the lateral direction X, different to that in the embodiments of FIGS. 4 to 7, and the dummy patterns 150 located at two sides of the branch segment 143 have different shapes and asymmetrical.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A circuit board, comprising:
   a substrate having a surface, an inner bonding area is defined on the surface and configured to be divided into a first area and a second area, the first area is located outside the second area;
   a plurality of inner leads located on the first area;
   at least one T-shaped circuit line located on the second area and including a main segment, a connection segment and a branch segment, the main segment is connected to the connection segment and extended along a lateral direction, the branch segment is connected to the connection segment and extended toward the first area along a longitudinal direction, wherein the branch segment is configured to be bonded with a bump; and
   at least one dummy pattern located between the connection segment and the plurality of inner leads and not electrically connected to the plurality of inner leads and the at least one T-shaped circuit line.

2. The circuit board in accordance with claim 1, wherein the main segment has a first width along the longitudinal direction and the connection segment has a second width along the longitudinal direction, the second width is less than the first width.

3. The circuit board in accordance with claim 2, wherein the branch segment has a third width along the lateral direction, and a quotient of the second and third widths is higher than or equal to 0.5.

4. The circuit board in accordance with claim 1, wherein the branch segment is extended toward one of the plurality of inner leads along the longitudinal direction.

5. The circuit board in accordance with claim 1, wherein the branch segment is extended to between two adjacent of the plurality inner leads along the longitudinal direction.

6. The circuit board in accordance with claim 1, wherein the branch segment includes a first end and a second end, the first end is connected to the connection segment, the second end is configured to be bonded with the bump, and the first end is wider than the second end.

7. The circuit board in accordance with claim 1, wherein the branch segment includes a first end and a second end, the first end is connected to the connection segment, the second end is configured to be bonded with the bump, and the first end is perpendicular to the second end.

8. The circuit board in accordance with claim 1 comprising two dummy patterns, wherein the dummy patterns are located at two sides of the branch segment respectively.

9. A flip chip interconnection, comprising:
a circuit board including a substrate, a plurality of inner leads, at least one T-shaped circuit line and at least one dummy pattern, an inner bonding area is defined on a surface of the substrate and configured to be divided into a first area and a second area, the first area is located outside the second area, the plurality of inner leads are located on the first area, the at least one T-shaped circuit line is located on the second area and includes a main segment, a connection segment and a branch segment, the main segment is connected to the connection segment and extended along a lateral direction, the branch segment is connected to the connection segment and extended toward the first area along a longitudinal direction, the at least one dummy pattern is located between the connection segment and the plurality of inner leads and not electrically connected to the plurality of inner leads and the at least one T-shaped circuit line;
a chip mounted on the inner bonding area and including a plurality of first bumps and at least one second bump; and
a solder layer located between the circuit board and the chip and configured to bond the plurality of first bumps to the plurality of inner leads and bond the at least one second bump to the branch segment.

10. The flip chip interconnection in accordance with claim 9, wherein the main segment has a first width along the longitudinal direction and the connection segment has a second width along the longitudinal direction, the second width is less than the first width.

11. The flip chip interconnection in accordance with claim 10, wherein the branch segment has a third width along the lateral direction, and a quotient of the second and third widths is higher than or equal to 0.5.

12. The flip chip interconnection in accordance with claim 9, wherein the branch segment is extended toward one of the plurality of inner leads along the longitudinal direction.

13. The flip chip interconnection in accordance with claim 9, wherein the branch segment is extended to between two adjacent of the plurality inner leads along the longitudinal direction.

14. The flip chip interconnection in accordance with claim 9, wherein the branch segment includes a first end and a second end, the first end is connected to the connection segment, the second end is configured to be bonded with the at least one second bump, and the first end is wider than the second end.

15. The flip chip interconnection in accordance with claim 9, wherein the branch segment includes a first end and a second end, the first end is connected to the connection segment, the second end is configured to be bonded with the at least one second bump, and the first end is perpendicular to the second end.

16. The flip chip interconnection in accordance with claim 9, wherein the circuit board includes two dummy patterns that are located at two sides of the branch segment respectively.

17. The flip chip interconnection in accordance with claim 10, wherein the at least one second bump has a fourth width and a quotient of the second and fourth widths is less than 2.

18. The flip chip interconnection in accordance with claim 10, wherein the connection segment has a first length along the lateral direction and the at least one second bump has a second length, a quotient of the first and second lengths is higher than or equal to 4.

19. The flip chip interconnection in accordance with claim 10, wherein a linear distance is defined from the connection segment to the at least one second bump, and a quotient of the linear distance and the second width is higher than or equal to 3.

* * * * *